United States Patent
Lee et al.

(10) Patent No.: US 6,312,567 B1
(45) Date of Patent: Nov. 6, 2001

(54) METHOD OF FORMING A (200)-ORIENTED PLATINUM LAYER

(75) Inventors: Dong Su Lee; Dong Il Chun; Dong Yeon Park; Eui Joon Yoon; Min Hong Kim; Hyun Jung Woo; Tae Soon Park, all of Seoul (KR)

(73) Assignee: Tong Yang Cement Corporation (KR)

( * ) Notice: Subject to any disclaimer, the term of this patent is extended or adjusted under 35 U.S.C. 154(b) by 0 days.

(21) Appl. No.: 09/320,797

(22) Filed: May 27, 1999

Related U.S. Application Data

(63) Continuation-in-part of application No. 08/688,521, filed on Jul. 30, 1996, now abandoned.

(30) Foreign Application Priority Data

Mar. 21, 1996 (KR) .................................................. 96-07663

(51) Int. Cl.[7] .................................................. C23C 14/34
(52) U.S. Cl. ................................ 204/192.15; 427/255.7; 427/250; 427/248.1; 438/778; 438/781; 438/763; 438/658; 438/660
(58) Field of Search ......................... 204/192.15, 192.18, 204/192.2, 192.22, 192.23; 427/100, 248.1, 255, 255.3, 250, 255.7; 438/778, 781, 763, 658, 660

(56) References Cited

U.S. PATENT DOCUMENTS

| | | | |
|---|---|---|---|
| 4,511,451 | 4/1985 | Sella et al. | 204/298 |
| 4,971,853 | 11/1990 | Chaiken et al. | 428/172 |
| 5,367,285 | 11/1994 | Swinehart et al. | 338/308 |
| 5,679,410 | 10/1997 | Sugita et al. | 427/523 |
| 5,736,422 | 4/1998 | Lee et al. | 437/201 |
| 6,025,205 | * 2/2000 | Park et al. | 438/3 |

FOREIGN PATENT DOCUMENTS

| | | | |
|---|---|---|---|
| 96/07763 | * 10/1997 | (KR) | C23C/14/34 |

OTHER PUBLICATIONS

Growth and characterization of reactively sputtered thin--film platinum oxides J.R. McBride, et al, Journal of Applied Physics 69(3), Feb. 1, 1991 pp. 1596–1604.

Highly (200)–oriented Pt films on $SiO_2/Si$ substrates by seed selection through amorphization and controlled and controlled grain growth, Kim, et al Journal of Material Research, Mar. 1999.

Changes in preferred orientation of Pt films deposited by a DC magnetron sputtering using $Ar/O_2$ gas mixtures, Kim, et al, Journal of Material Research, Apr. 1999.

(100) Oriented Platinum Thin Films Deposited by DC Magnetron Sputtering on $SiO_2/Si$ Substrates, Material Research Society Symposium proceedings, vol. 441, May 1997.

* cited by examiner

Primary Examiner—Nam Nguyen
Assistant Examiner—Steven H. Ver Steeg
(74) Attorney, Agent, or Firm—Ladas and Parry

(57) ABSTRACT

A method of depositing a (200)-oriented platinum thin film on a substrate, including the steps of forming a oxygen containing platinum layer on the surface of a silicon wafer heated to a temperature range over room temperature and not exceeding 700° C. under a mixed gaseous atmosphere of oxygen and inert gas and annealing the substrate at a temperature between 400° C. and 1000° C. The platinum thin film formed according to the present invention in (200)-oriented and does not have any conventional defects such as hillocks or voids.

26 Claims, 13 Drawing Sheets

METHOD OF FORMING A (200)-ORIENTED PLATINUM LAYER

CROSS-REFERENCE TO RELATED APPLICATION

This application is a continuation-in-part application of U.S. patent application Ser. No. 08/688,521 filed Jul. 30, 1996 and entitled, "a method of depositing a platinum layer with a preferred (200) orientation on a substrate and an electronic device having a platinum layer deposited by the method thereof", now abandoned.

BACKGROUND OF THE INVENTION

1. Field of the Invention

The present invention relates to a technique for depositing a platinum thin film or layer on a substrate as a bottom electrode of a ferroelectric oxide thin film device or a semiconductor device. More particularly, the present invention relates to a technique for controlling the platinum thin film structure to have a preferred (200) orientation in order to improve the electrical properties of an oxide thin film device employing platinum thin films as a bottom electrode for an electronic device.

2. Description of the Prior Art

Semi-conductive, dielectric, ferroelectric, superconductive and magnetic ceramic materials, used in electronic devices tend to become ever thinner in line with the trends of miniaturization, high-density integration and functional elevation of electronic ceramic parts or devices. The substrates used for electronic ceramic parts can be classified into three types. The first type comprises a single crystal silicon generally called a silicon wafer. The second type comprises the other single crystal materials such as MgO, $SrTiO_3$ or $Al_2O_3$. The third type comprises polycrystal materials such an alumina or diamond.

Poly-silicon has been widely used as a bottom electrode material in tie conventional memory cells without any critical problems. However, it is generally accepted that it can not be used any more as a bottom electrode to manufacture DRAM with over 1G bit and FRAM (Ferroelectric Random Access Memory) which is a new type non-volatile memory. Because high dielectric or ferroelectric oxide thin films such as perovskite structure oxides, bismuth-layered perovskite structure oxides, tungsten-bronze type structure oxide, $ReMnO_3$ (Re: rare-earth element) and $BaMF_6$ (M: Mn, Co, Ni, Mg, Zn), should be formed on FRAM, on DRAM devices requiring high degree of integration over 1 G bit, or around the core part of all types of oxide thin film sensors or actuators. However, such high-dielectric oxide films need to be formed under an oxidation atmosphere and high temperature (higher than 500° C.), which may cause problems relating to the polysilicon. For example, if polysilicon is employed as the bottom electrode in a DRAM cell using high-dielectric materials as a capacitor, serious problems may occur due to oxidation of the polysilicon under the high temperature (over 500° C.) and oxidation atmosphere during formation of the high-dielectric oxide thin films. For this reason, platinum is being investigated for substituting for a polysilicon electrode of a memory cell employing a high-dielectric or ferroelectric oxide, because platinum is stable under high temperature and an oxidation atmosphere.

Platinum, known to melt under high temperature of about 1774° C., is thermally stable, not reacting with any other chemical substances. Platinum is expected to overcome the chronic problems (e.g., generation of the residual stress, isolation of the substrate, or variation of the interfacial properties, etc.), which are caused by the lattice mismatch occurring in the formation of thin films due to similarity of the lattice parameter of the platinum to the ferroelectric oxide material of Perovskite structure. Generally, the platinum lattice parameter is 3.9231 Å, while the ferroelectric oxide material of Perovskite structure in about 3.9 Å.

However, depositing platinum thin films with a conventional method is known to pose a number of problems.

First, it is very difficult to form chemical bonding between the insulating oxide layer and the platinum layer and thug the adhesive strength between the platinum layer and the substrate is weak. One of the attempts that has been made to solve this problem is using a glue layer between the platinum layer and the insulating oxide layer. According to this attempt, a thin film layer composed of one or two elements selected from the group consisting of Ta, Ti, TiN and W in formed on the insulating oxide layer before depositing a platinum thin film layer so that the thin film layer formed on the oxide layer serves as a glue layer between the insulating oxide layer and the platinum layer.

However, employment of this method is known not only to complicate the process of forming a bottom electrode but also to generate additional problems. In the post-process such as annealing treatment or deposition of a ferroelectric oxide layer, the substance of the glue layer diffuses through the platinum layer and reacts with the oxygen of the ferroelectric oxide layer. This disables the platinum thin film from functioning as an electrode and deteriorates the platinum surface smoothness.

According to the prior art, there is also a problem in that hillocks or voids are formed on the platinum layer in the process after the annealing treatment or deposition of the ferroelectric oxide layer. These hillocks or voids cause either shortening of the circuits or heterogeneity in the formation of a high dielectric or ferroelectric oxide layer.

An approach for solving these problems of prior art is disclosed in U.S. Pat. No. 5,736,422 to Lee et al. The invention disclosed in the '422 patent introduced a concept of "depositing platinum in two steps, under an oxygen containing gaseous atmosphere and then under an inert gas atmosphere" into the pertinent technical field. According to one embodiment of the invention, a platinum thin film is deposited on an insulating oxide layer on a silicon wafer in two steps and under different atmospheres. The first step is to deposit an oxygen containing platinum thin film, as opposed to pure platinum, under an oxygen containing atmosphere. The second step is to deposit a pure platinum layer under an inert gas atmosphere. And, the resulting film is annealed. Through this annealing process, the oxygen within the oxygen containing platinum film is removed and the platinum film formed thereby and the additionally deposited platinum film become stable.

According to the description in the '422 patent, "an oxygen containing gaseous atmosphere" is defined as a mixture of inert gas (Ar, Kr, Xe, etc.) with either oxygen or ozone gas mixture. The term, "oxygen containing platinum thin film" is understood to mean a platinum film that oxygen components contained therein partially may form platinum oxide, but most of them, e.g. more than 50% exist within grain boundaries or lattices in the platinum layer structure without being chemically bonded to the platinum. In other words, oxygen is contained in the oxygen containing platinum layer that is not present as platinum oxide.

U.S. Pat. No. 4,511,451 to Sella et. al., discloses a method for forming a thin layer of pure platinum oxide. The term, "platinum oxide" means PtO or $PtO_2$, although $PtO_2$ is exampled in the '451 patent, and differs from the term, "oxygen containing platinum" in the strict sense. These terms and definitions are also applicable to the present invention.

It is well known that oxygen may be contained in the depositing atmosphere when employing an insulating thin film on the substrate. However, the oxygen contained in the depositing atmosphere has been regarded as an impure substance harmful for the formation of the platinum thin film. This thought has been changed by the above-mentioned inventions.

The '422 patent discloses a new technique for platinum thin-film deposition process comprising steps of: providing a silicon wafer; forming an insulating oxide layer on a surface of the silicon water; depositing a platinum layer on the insulating oxide layer under an oxidation atmosphere to form an "oxygen containing platinum thin-film"; depositing an additional platinum thin-film to a desired thickness on the oxygen containing platinum thin-film under a complete inert atmosphere; and annealing the silicon substrate at a temperature of 400° C. to 1,300° C. in order to remove oxygen present within the oxygen containing platinum thin-film and to stabilized the entire platinum thin-film.

According to the '422 patent, oxygen and argons gases are introduced into a vacuum chamber to form an oxidation atmosphere and RF power in supplied to the platinum target, thereby an oxygen containing platinum rather than pure platinum thin-film being deposited on the wafer due to oxygen contained within the atmosphere and admixed into the first deposited platinum layer. As well known in the art, during the sputtering process, a part of atmospheric gases are ionized and impinged to the platinum target. As a result, platinum atoms are run out and deposited together with oxygen within the oxidation atmosphere on an object being processed, so that an "oxygen containing platinum thin-film" can be formed on the object.

In addition to the aforementioned disadvantages in the prior art, there still remains another unresolved problem of controlling the structural orientation of the platinum thin film. It is known under the conventional method that the platinum thin film, which is deposited on the oxide insulating layer, generally are not (200)-oriented. As a rule, anisotropic materials have different physical properties depending on their structural orientations.

If the platinum thin film is employed as a bottom electrode in an electronic device, the preferred orientation of the platinum thin film affects the preferred orientation of the material formed on the platinum thin film, ultimately affecting the physical properties of the final device. For instance, if a platinum bottom electrode in (111)-oriented in a process of manufacturing a device utilizing ferroelectric oxide material, the ferroelectric oxide thin film formed on the platinum bottom electrode cannot be oriented to the c-axis direction, thereby deteriorating the working efficiency of the electronic device having the platinum thin film structure as described above and generating the fatigue effect of the device in operation.

It is expected in the pertinent technical field that, if the platinum thin film employed as a bottom electrode is (200)-oriented, the ferroelectric oxide thin film, which in formed on the platinum thin film, will be mostly oriented to the c-axis direction. On the account of this preferred orientation, the working efficiency of the electronic device is expected to be highly increased, while its fatigue effect in expected to be drastically lowered.

For this reason, a great deal of research has been conducted for obtaining a (200)-oriented platinum electrode. It is known, however, that the same result can be achieved by employing a single crystal substrate such as MgO (100) which has a similar lattice parameter to the platinum. However, it is considered impracticable to employ a single crystal substrate such as MgO in manufacturing semiconductor devices such as DRAM or FRAM. This is because processing the substrate itself is not only difficult but also unsuitable to the presently available processes of manufacturing a silicon integrated circuit.

Because of above-mentioned reasons, attempts have been made to employ a conducting oxide electrode such as $IrO_2$, $RuO_2$, LSCO, or YBCO as a bottom electrode. In this case, however, problems such as roughening surface or increasing leakage current may also take place. Therefore, no satisfactory research result regarding a (200)-oriented platinum thin film has yet been reported in this field to date.

SUMMARY OF THE INVENTION

The object of the present invention is therefore to resolve the problems in the art related to formation of platinum thin films. In particular, the object of the present invention is to provide a method of forming a (200)-oriented platinum thin film.

In order to achieve the above object, the present invention provides a method of forming a (200)-oriented platinum thin film on a substrate, comprising the steps of: providing a substrate; forming an insulating oxide layer on the surface of the substrate; forming an "oxygen containing platinum layer" on the insulating oxide layer by depositing platinum on the insulating oxide layer substrate at a temperature between about 25° C. and about 700° C. under an oxygen containing atmosphere, which consists of a mixture of an inert gas with either oxygen or ozone existing under a partial pressure ratio of 5% to 15%, and annealing the oxygen containing platinum layer at a temperature between about 400° C. to about 1000° C., without additional deposition of platinum on the oxygen containing platinum layer, and thus converting the oxygen containing platinum layer into a platinum layer that is substantially free of oxygen and (200)-oriented.

A silicon wafer is more preferably employed as a substrate according to the method of the present invention because of its low price and readiness of availability. However, a group of single crystal materials of such as MgO, $SrTiO_3$ and sapphire, or materials of polycrystals such a as alumina or diamond, or metallic materials, may also be employed as a substrate.

$SiO_2$, alumina, MgO, glass or other insulating materials may be employed as an insulating oxide layer to be formed on the substrate.

Also, platinum can be deposited using any process selected from DC magnetron sputtering, vacuum evaporation, MOCVD (Metal Organic Chemical Vapor Deposition), and ion plating processes.

The term, "oxygen containing atmosphere" in this context is used to mean a gaseous atmosphere which consists of a mixture of inert gas with either oxygen or ozone under a partial pressure ratio of 5% to 15%. The inventors have found that if the partial pressure ratio of oxygen components is too high or excessive platinum oxide is formed during the deposition of platinum under any oxygen containing atmosphere, it is difficult or impossible for the resultant platinum layer to be (200)-oriented.

In the present invention, the substrate is preferably maintained at a temperature between 25° C. and 700° C. while platinum is being deposited on an insulating oxide layer under the oxygen containing atmosphere. It is also possible to obtain (200)-oriented platinum thin films which are much superior to the conventional thin film, even if the platinum is deposited under at a temperature higher or lower than said substrate temperature range. However, in order to achieve the (200) orientation degree, $f_{200}$, over 90%, it is desirable to maintain said substrate temperature above 25° C. and not exceeding 700° C., more preferably between 300° C. and 700° C. The (200) orientation degree, $f_{200}$, in generally defined by the following equation.

$$f_{200} = \frac{I_{200}}{I_{111} + I_{200}} (\times 100)$$

In the above equation, $I_{111}$ represents signal intensity of (111) direction in X-ray diffraction, while $I_{200}$ represents signal intensity of (111) direction in X-ray diffraction.

One embodiment of the invention comprises forming at least one or more thin films selected from the group consisting of a silicon integrated circuit film, a ferroelectric film, a magnetic film, a piezoelectric film and a dielectric film above the (200)-oriented platinum layer. In a preferred embodiment, the ferroelectric film is one or more films selected from the group consisting of BT ($BaTiO_3$),PT ($PbTiO_3$),PZT($PbZr_{1-x}Ti_xO_3$),PLZT ($Pb_{1-x}La_xZr_{1-y}Ti_yO_3$), and BST($Ba_{1-x}Sr_xTiO_3$), and SBTO($SrBi_2Ta_2O_9$).

BRIEF DESCRIPTION OF THE DRAWINGS

The other objects, characteristics and advantages of the present invention will be clearly understood if reading the following detailed description of the preferred examples with reference to the accompanying drawings in which.

DETAILED DESCRIPTION OF THE PREFERRED EMBODIMENTS

The present invention will be more specifically explained with reference to FIGS. 1B and 2B, wherein silicon wafer is employed as a substrate.

Figure 1A:
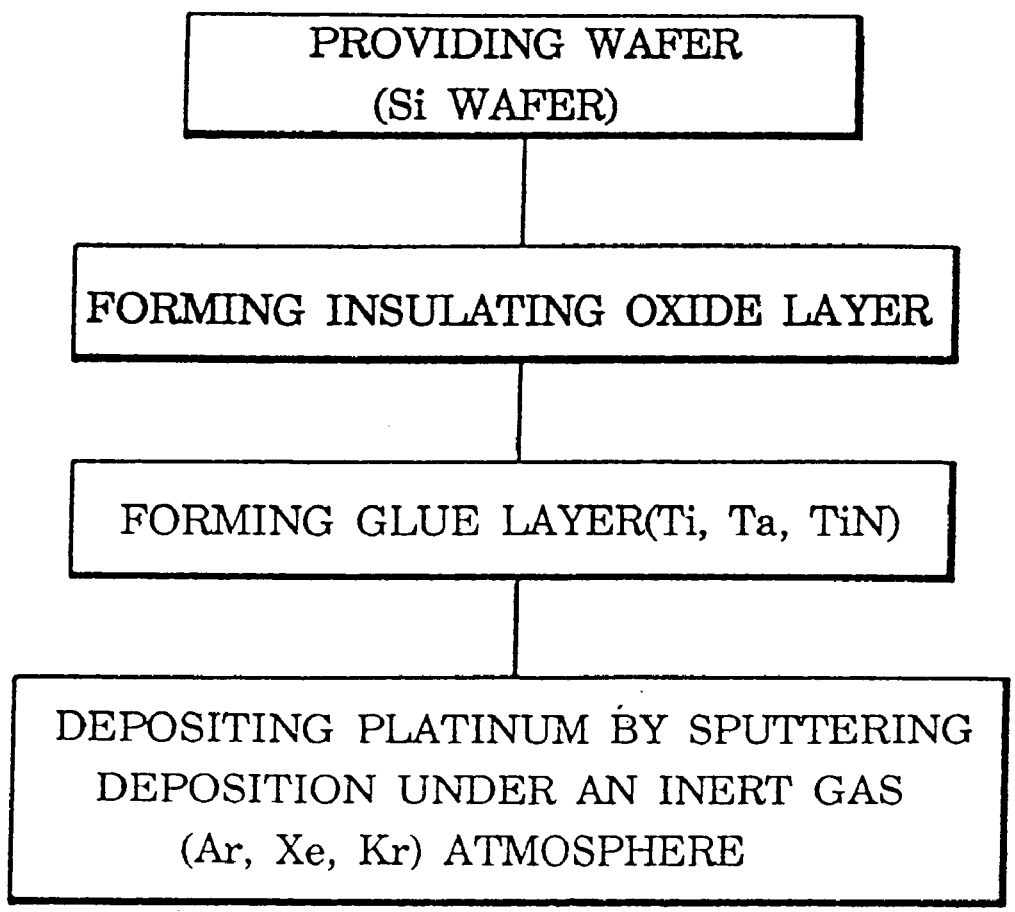
FIG. 1A is a flow chart of a conventional production process using a glue layer during the step of depositing a platinum thin film by sputtering.
Figure 1B:
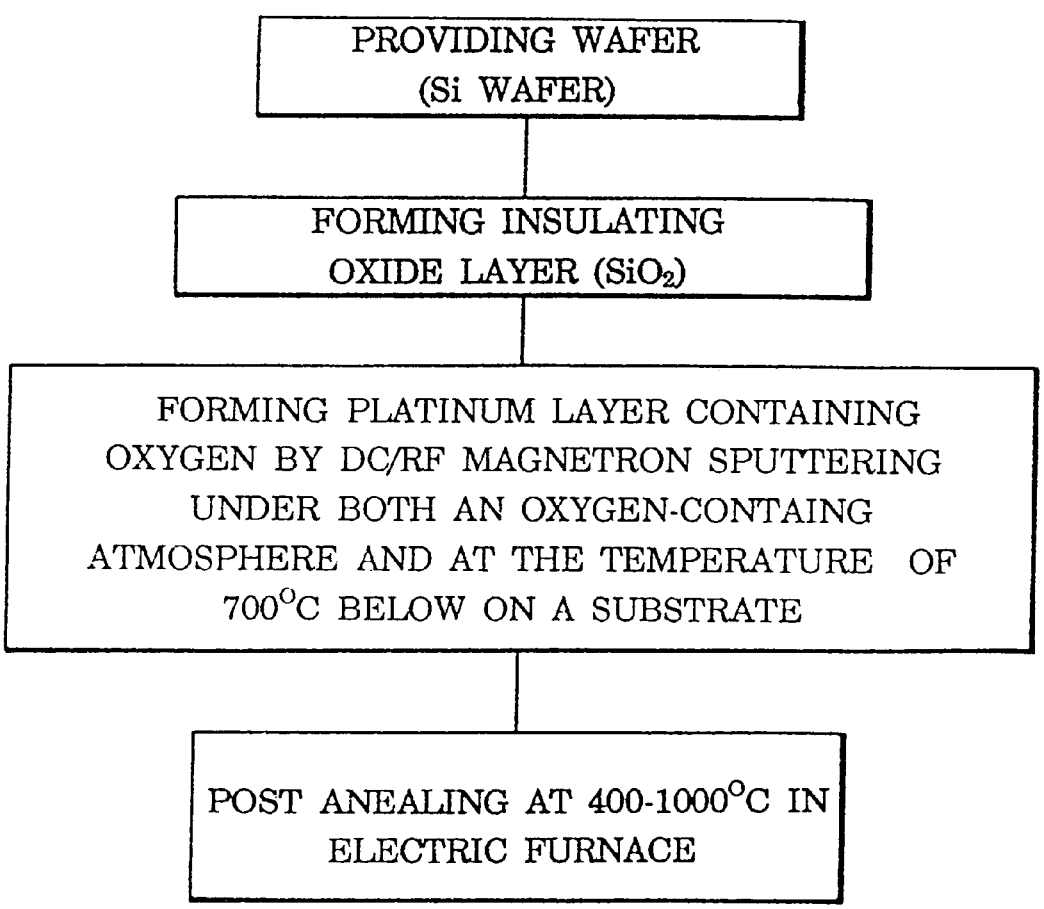
FIG. 1B is a flow chart showing a process according to one preferred embodiment of the present invention.

A step of forming insulating oxide layer shown as an example in FIG. 1B is a process for forming an insulating oxide layer (silicon oxide layer: $SiO_2$) on the silicon wafer surface. Any one of the thermal oxide method, wet oxide method, or chemical vapor deposition method (CVD) may be used in the process.

In the next step, platinum is deposited on the insulating oxide layer under an atmosphere consisted of a mixture of inert gas (Ar, Xe, Kr, etc.) with either oxygen or ozone, thereby forming an oxygen containing platinum thin film on the insulating oxide layer. In this step, the substrate is maintained at a temperature between about 25° C. and about 700° C.

In the next step, the silicon wafer is annealed at a temperature between about 400° C. and about 1,000° C. in order to remove oxygen from the oxygen containing platinum layer and to improve the stability of the platinum thin film formed thereby. The annealing temperature range and the annealing time can be variably defined according to the desired microstructure.

Figure 2A:
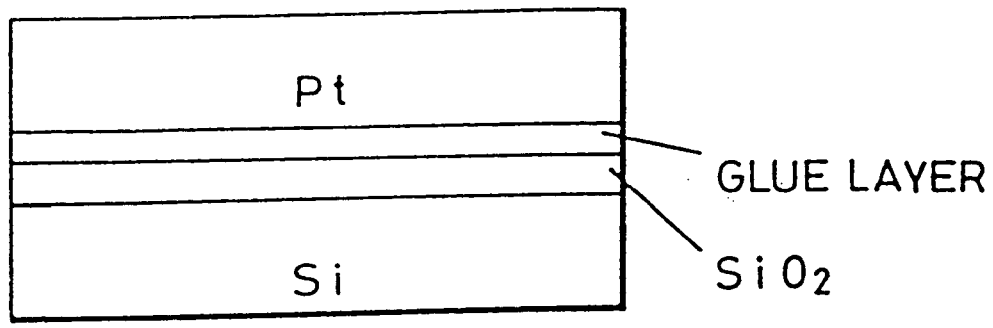
FIG. 2A is a cross-sectional view of the silicon wafer deposited with a platinum thin film by a conventional method employing a glue layer.
Figure 2B:
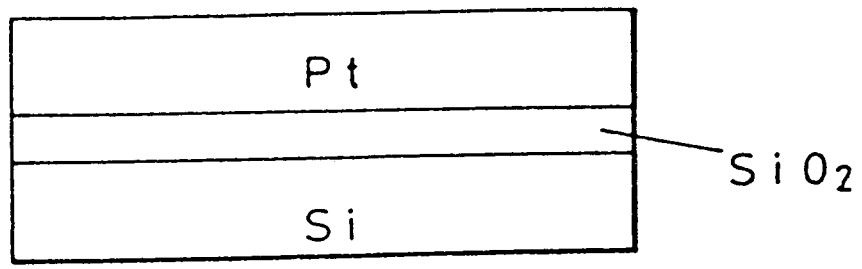
FIG. 2B is a cross-sectional view of the silicon wafer deposited with a platinum thin film formed according to the present invention.
Figure 3A:
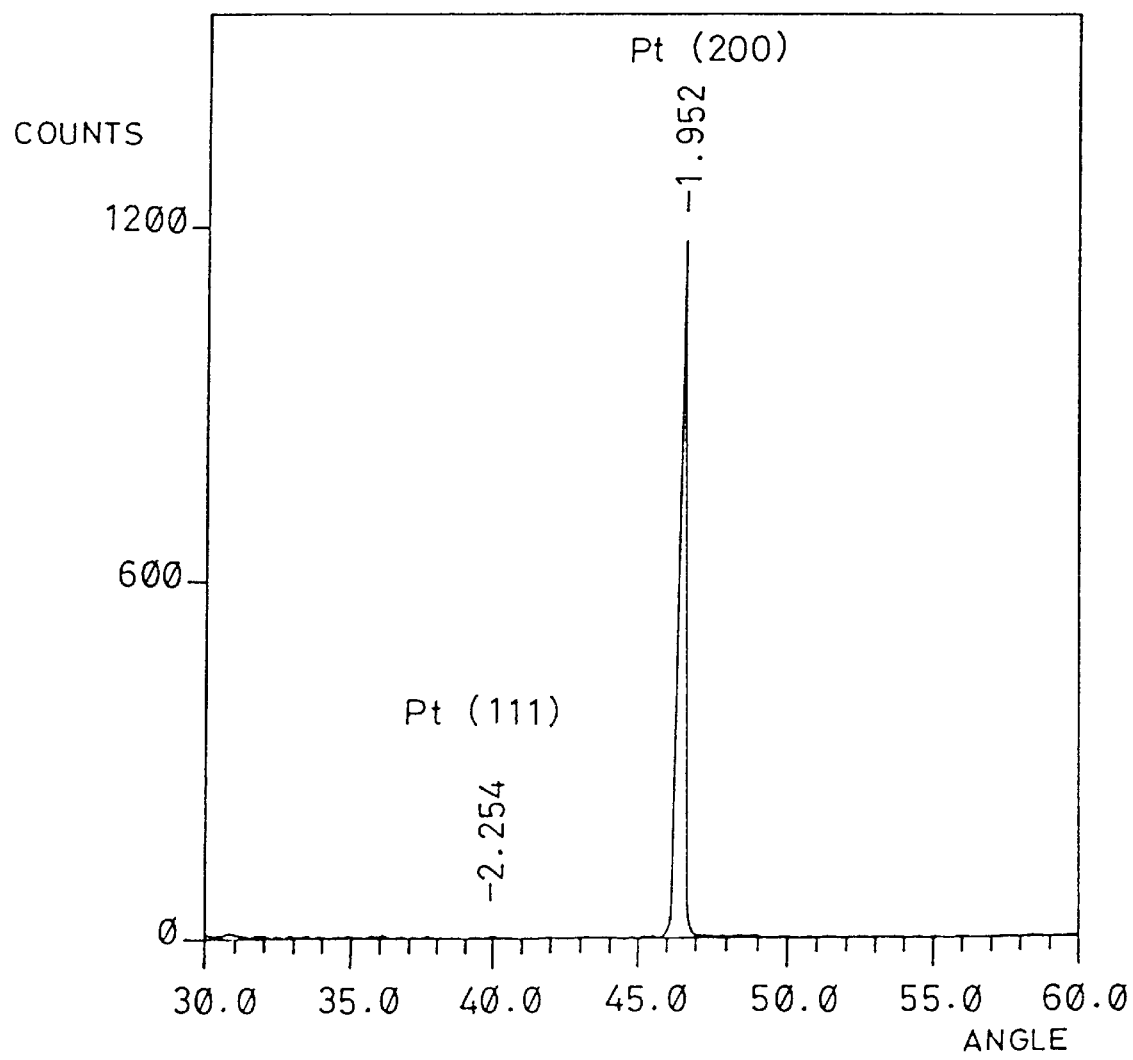
FIGS. 3A and 3B are X-ray diffraction (XRD) patterns of platinum layers of samples 1 and 4 formed according to the present invention, respectively.
Figure 3B:
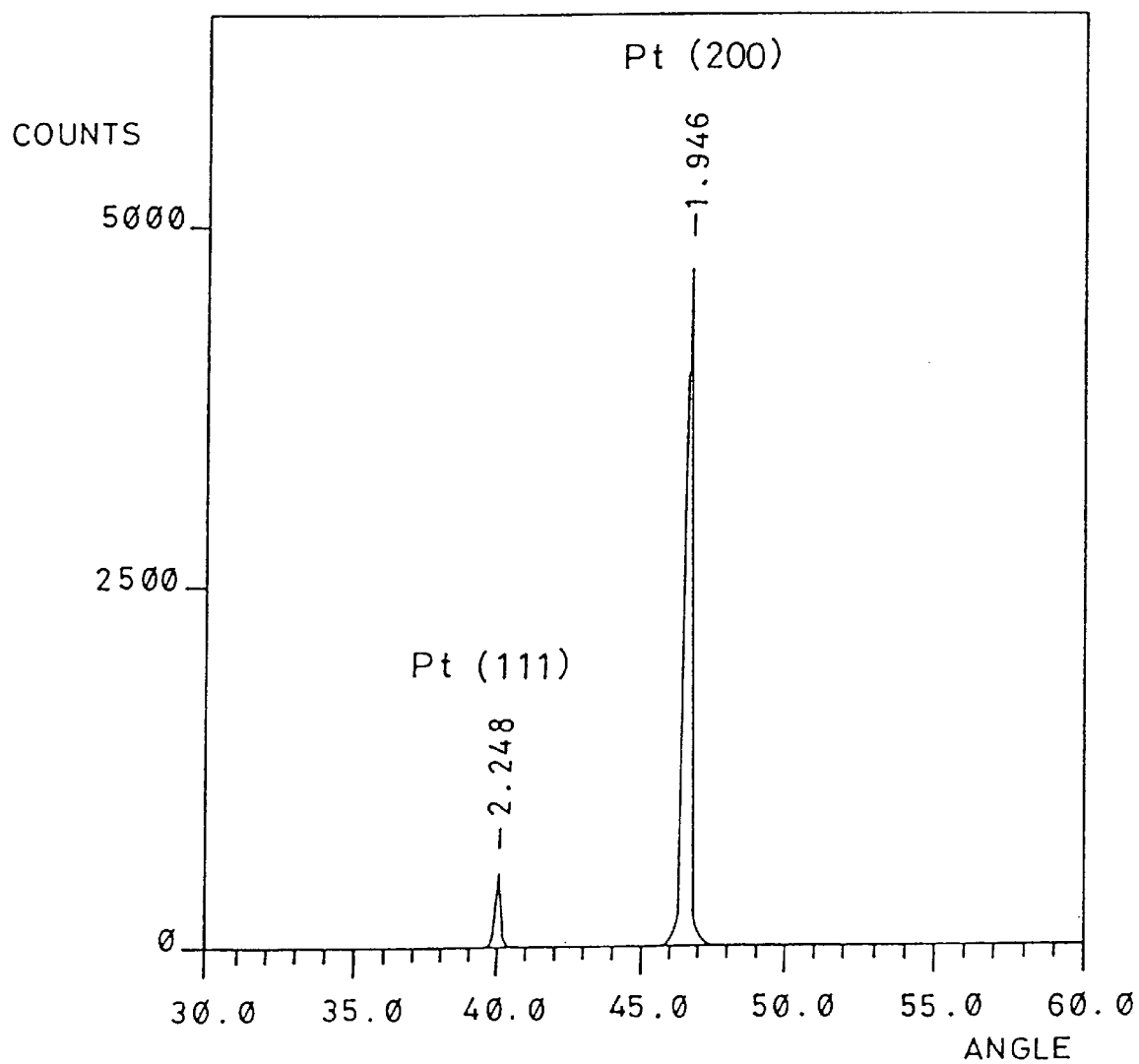
Figure 4A:
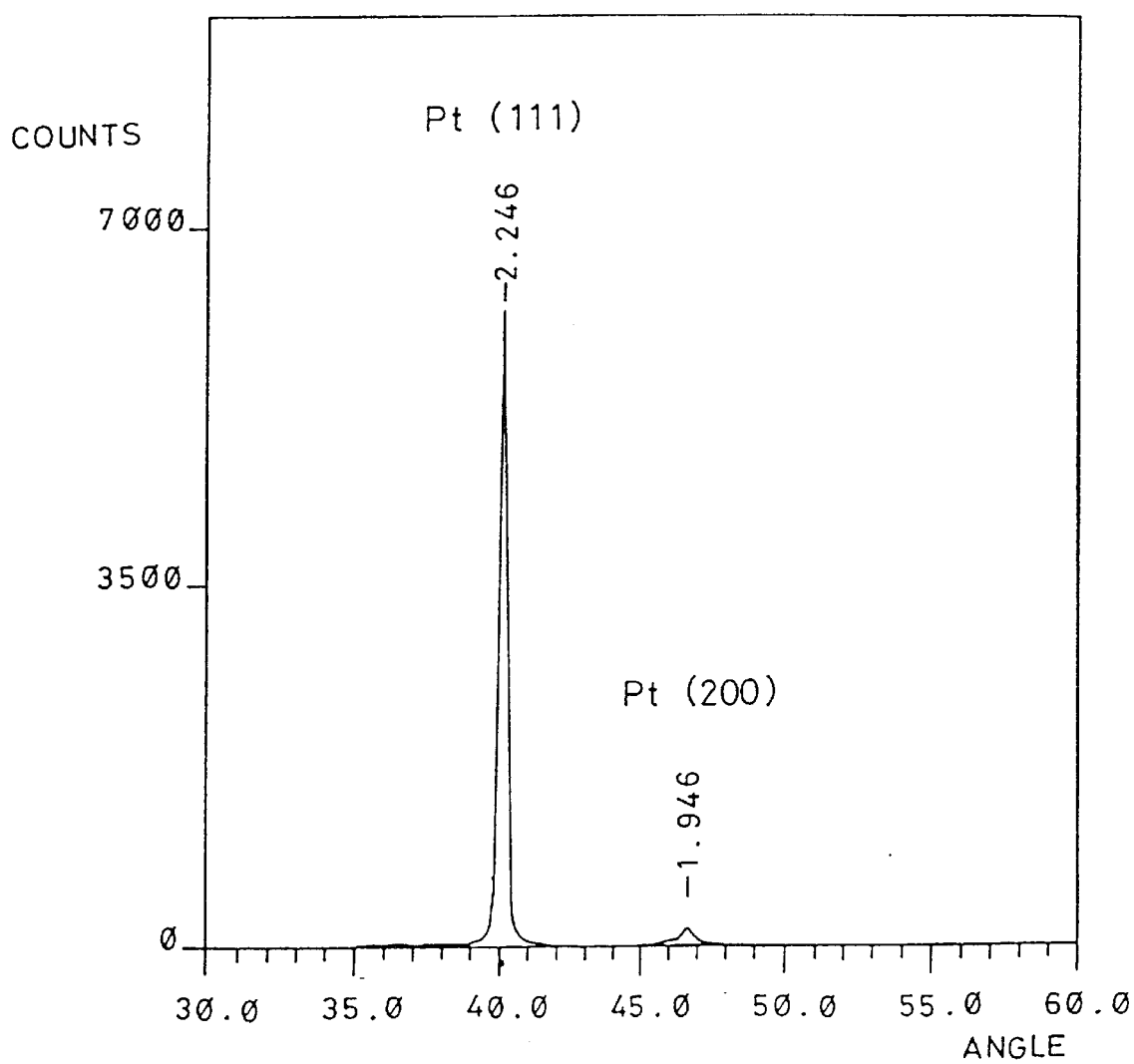
FIGS. 4A and 4B are XRD patterns of platinum layers of samples 5 and 6 formed according to conventional methods, respectively.
Figure 4B:
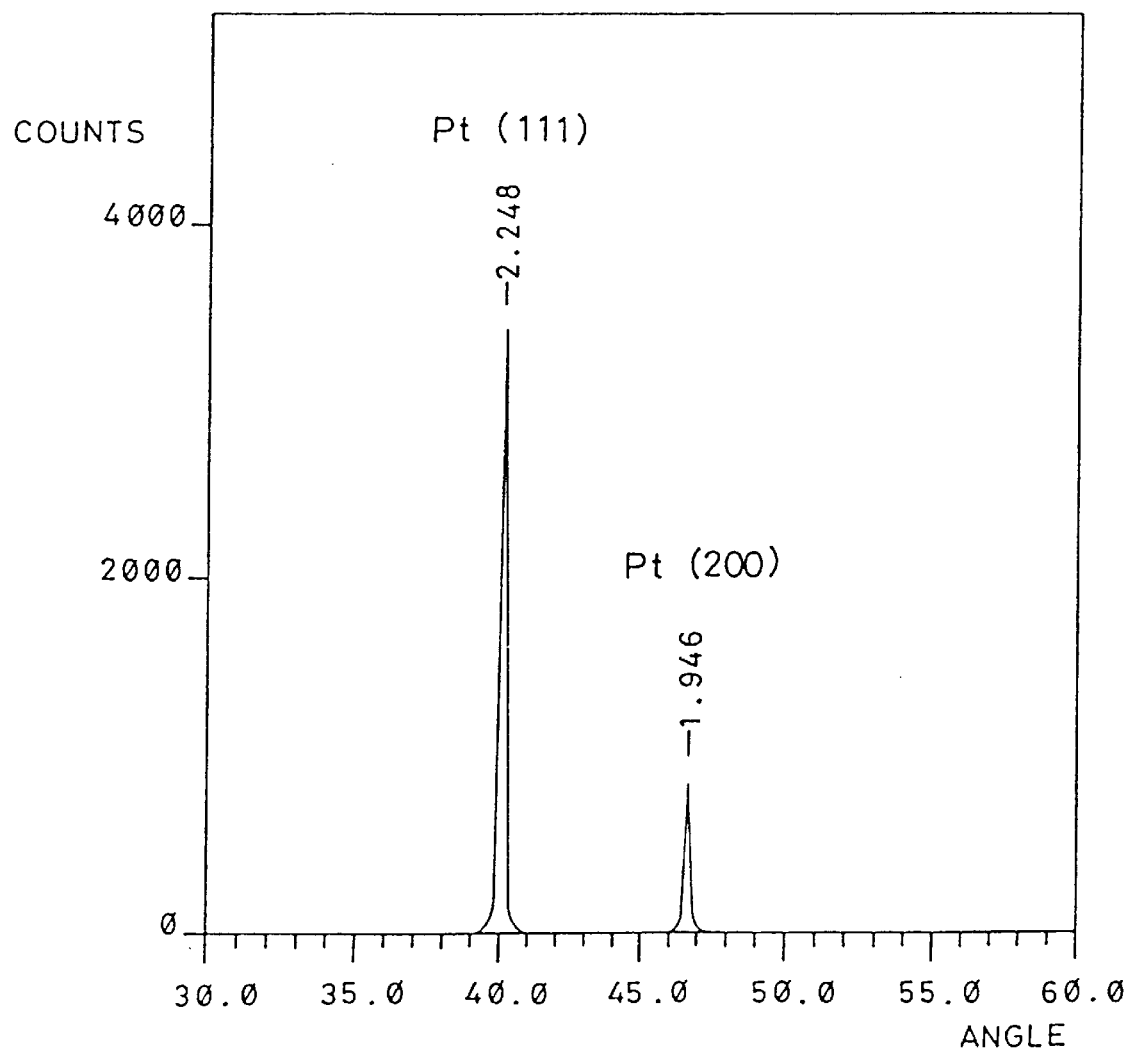
Figure 7A:
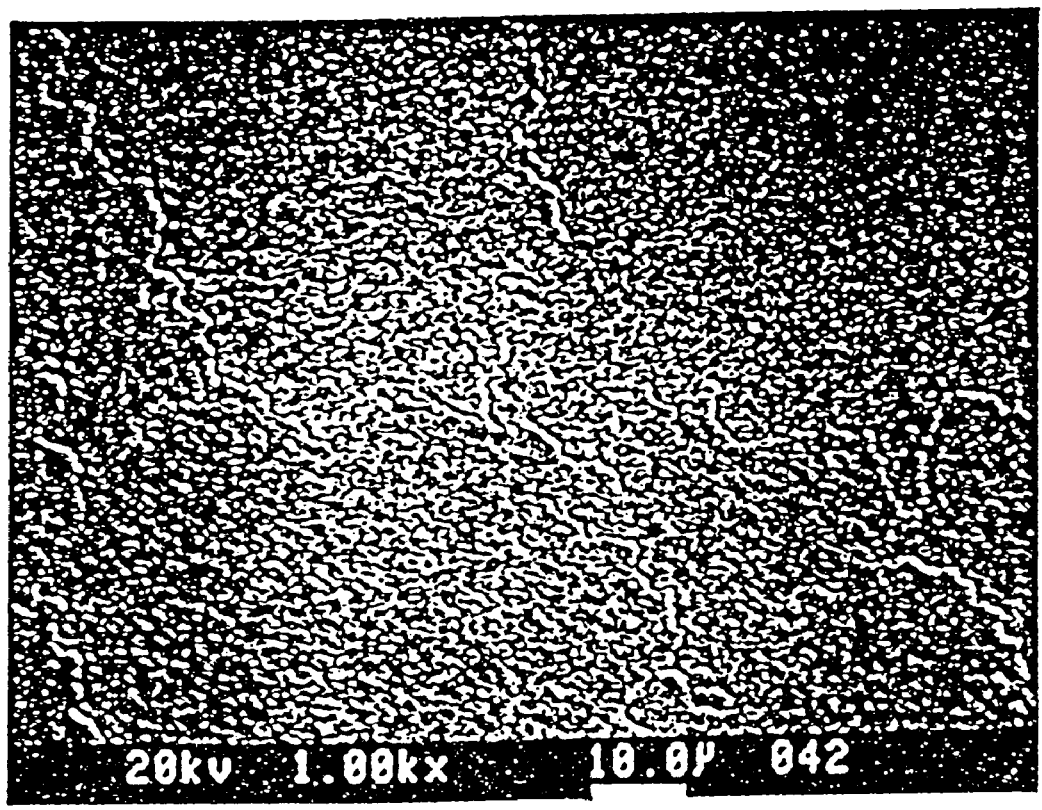
FIG. 7A is a scanning electric microscope (SEM) photograph showing the surface of sample 1 magnified by 1,000 times.
Figure 7B:
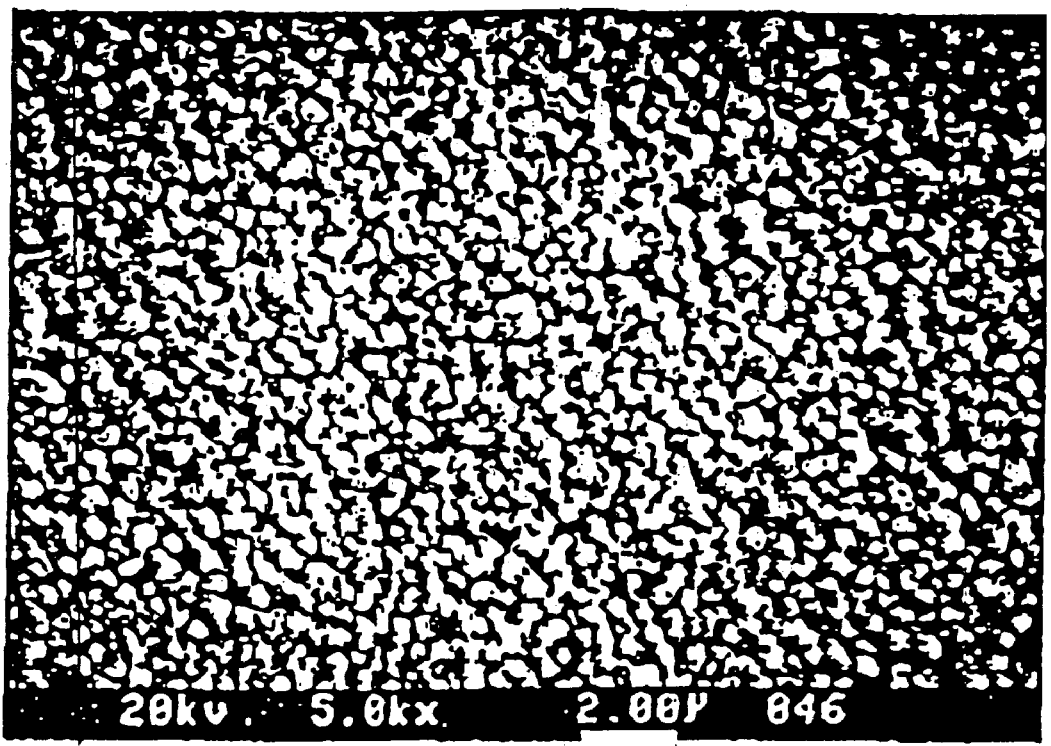
FIG. 7B is a SEM photograph showing the surface of sample 4 magnified by 5,000 times.

A cross-sectional view of the silicon wafer with a platinum layer formed by said process is illustrated in FIG. 2B. An oxygen containing platinum layer, which is formed by depositing platinum under an oxygen containing atmosphere, has strong adhesive strength to the substrate ($SiO_2$/Si, $Al_2O_3$/Si, MgO/Si, and grass/Si) on which an oxide insulating layer has been formed, as disclosed in the '422 patent. However, according to the present invention, additional deposition of platinum under an inert gas atmosphere is not performed unlike the '422 patent. In other words, the platinum thin film is formed by depositing platinum under the oxygen containing atmosphere to form an oxygen containing platinum thin film and then annealing the oxygen containing platinum thin film, without additionally depositing platinum after forming the oxygen containing platinum layer, thereby converting the oxygen containing platinum thin film to an platinum thin film free of oxygen. Surprisingly, it has been observed that the platinum thin film formed according to the present invention has a preferred (200) orientation as being apparent from X-ray diffraction patterns of FIGS. 3A and 3B. Further, a microstructure of the present invention has been proved that it has no hillocks and voids on the surface of the platinum layer as illustrated in FIGS. 7A and 7B. The present invention can also provide either large or small size of grains as illustrated in FIGS. 7A and 7B.

Although the present invention takes a silicon water as a standing sample for the convenience of explanation, substantially same results may be obtained even if other types of substrate were to be employed instead of a silicon substrate. The present invention will now be explained more specifically with the results of the experiments performed by the inventors.

EXAMPLE (i)

Initially, before taking the step of forming a oxygen containing platinum thin film, a 3,000 Å $SiO_2$ layer was formed on the 4 inch silicon wafer by the wet oxidation method. Then, platinum was deposited on the SiO$_2$ layer under an oxygen containing atmosphere, thereby forming an oxygen containing platinum layer with an approximately 6,000 Å thickness. In particular, platinum was deposited under the following conditions. (Here, the purity of the employed platinum target was 99.99%, while its diameter was 4 inches.)

Base pressure; 2×10$^{-6}$ Torr
Atmosphere: Ar+O$_2$ (Ar/O$_2$ pressure ratio: 9/1)
Wafer temperature: 25° C.
Rotation speed of wafer: 5 rpm
Sputtering power: 200 W
Distance between target and wafer: 13 cm Following the platinum deposition step, the silicon wafer formed with the oxygen containing platinum thin film was annealed in an electric furnace at the temperatures between 800° C. and 1,000° C. for two hours. As a result, oxygen was removed from the oxygen containing platinum the oxygen containing platinum thin film was converted into a platinum thin film free of oxygen an illustrated in FIG. 2B.

EXAMPLE (ii)

Initially, a 3,000 Å SiO$_2$ layer was formed on a 4-inch silicon wafer by the wet oxidation method.

In the next step, an oxygen containing platinum thin film was formed with an approximately 3,000 Å thickness on the surface of the SiO$_2$ layer by depositing platinum under the following conditions.

Base pressure: 2×10$^{-6}$ Torr
Atmosphere: Ar+O$_2$ (Ar/O$_2$ pressure ratio: 9/1)
Wafer temperature: 300° C.
Rotation speed of wafer; 5 rpm
Sputtering power: 130 W
Distance between target and wafer; 15 cm In the next step, the silicon wafer was annealed in an electric furnace at a temperature between 400° C. and 700° C. for two and half hours.

The following table illustrates different properties such as (200) orientation degree, resistivity and formation of voids or hillocks of platinum thin films deposited on silicon wafers, according to the above example and various conventional methods of depositing a platinum thin film. In this regard, the resistivity is calculated from both the sheet resistance value measured by a 4-point probe method and the thickness measured by a stylus method.

TABLE

|  | Nos. | D. A. | W. T. (° C.) | A. T. (° C.) | f$_{200}$ | R ($\mu\Omega \cdot$ cm) | V/H |
|---|---|---|---|---|---|---|---|
| example i) | 1 | Ar + O$_2$ | 25 | 800 | 0.991 | 12.44 | X |
|  | 2 | Ar + O$_2$ | 25 | 1,000 | 0.924 | 12.25 | X |
| example ii) | 3 | Ar + O$_2$ | 300 | 400 | 0.944 | 45.48 | X |
|  | 4 | Ar + O$_2$ | 300 | 700 | 0.902 | 13.29 | X |
| comparative | 5 | Ar/Ar | 25 | 700 | 0.025 | 14.84 | O |
| examples | 6 | Ar | 25 | 700 | 0.197 | 14.03 | O |
|  | 7 | Ar + O$_2$ | 200 | Non anneal | Platinum oxide | >1,000 | X |
|  |  |  |  | 800 | 0.21 | 14.23 | X |
|  | 8 | Ar + O$_2$/Ar (two steps) | 25 | 800 | 0.156 | 13.21 | X |

*Abbreviations
D. A.: deposition atmosphere
W. T.: wafer temperature during deposition
A. T.: annealing temperature
R: resistivity
V/H: formation of voids/hillocks

REMARKS

1) In the deposition atmosphere, "Ar+O$_2$" represents deposition of a platinum thin film with argon-oxygen or ozone mixture, while "Ar/Ar" represents deposition of a platinum thin film on a Ti layer with argon gas after depositing the Ti layer on the substrate an a glue layer with argon gas. "Ar" represents deposition of a platinum thin film on a silicon wafer (SiO$_2$/Si) with argon gag without a glue layer.

2) f$_{200}$ represents (200) orientation degree.

3) "O" represents formation of voids or hillocks, and "X" represents no formation of voids or hillocks.

Samples 1 and 2 were obtained an a result of annealing treatment for silicon wafer an which a platinum thin film has been deposited according to example (i) of the present invention.

Samples 3 and 4 were obtained as a result of annealing treatment for silicon wafer on which a platinum thin film has been deposited according to the above example (ii).

Sample 5 was provided with a platinum thin film deposited onto the silicon wafer with Ti glue layer under the inert gas atmosphere, and then annealed at the temperature of 700° C. for one hour.

Sample 6 was provided with a platinum thin film deposited onto the silicon wafer without any glue layer under the inert gas atmosphere, and then annealed at the temperature of 700° C. for one hour.

Figure 5A:
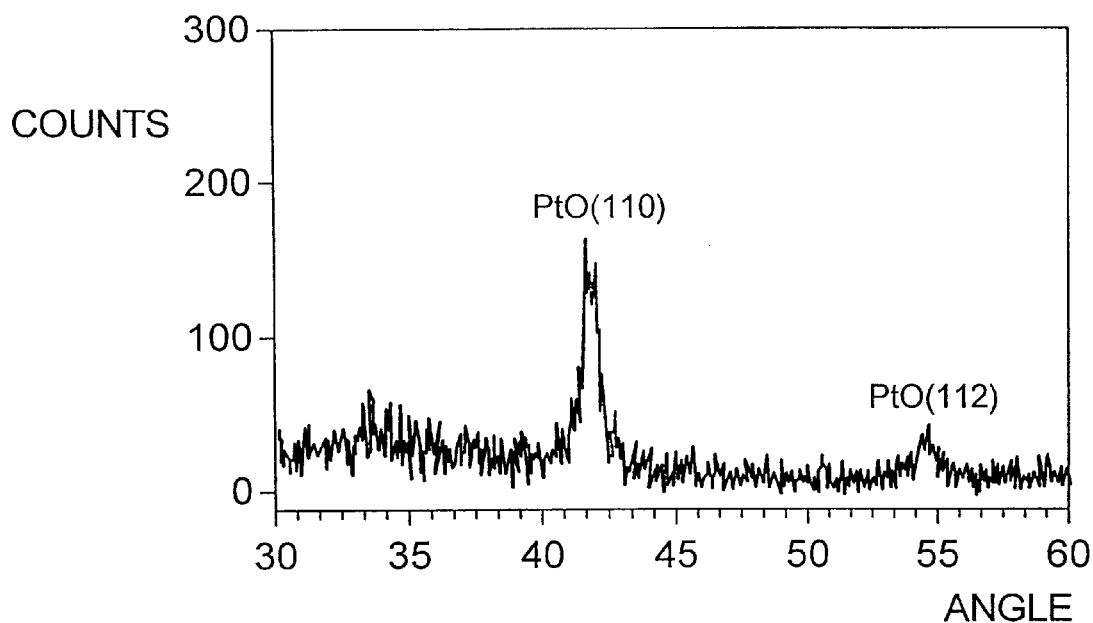
FIG. 5A and an XRD pattern of an platinum oxide (PtO) layer of sample 7.
Figure 5B:
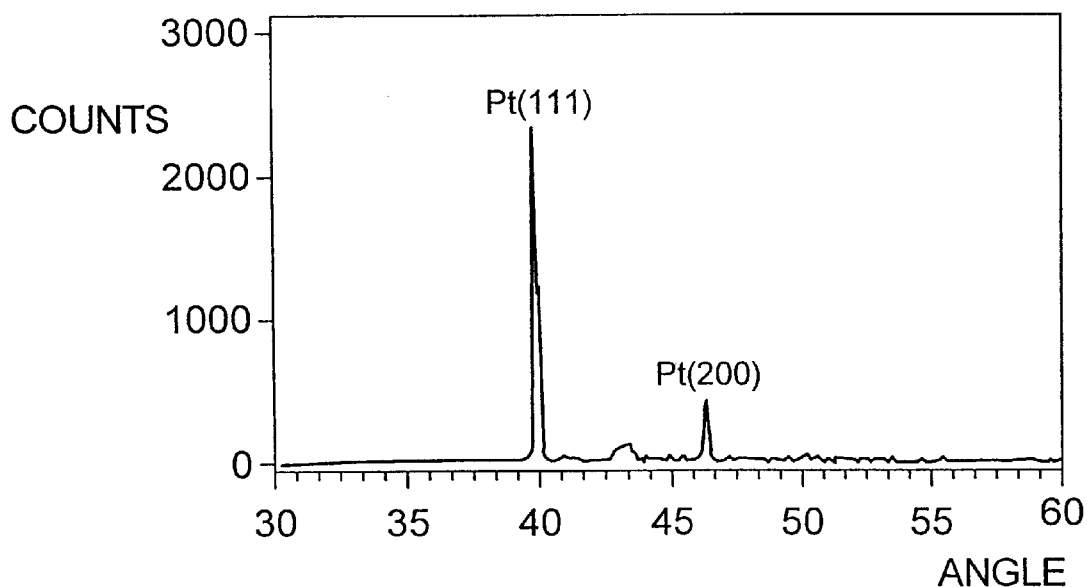
FIG. 5B is an XRD pattern of a platinum layer obtained after annealing the platinum oxide layer of sample 7.

Sample 7 was firstly provided with a platinum oxide (PtO) film. The platinum oxide was (110)-oriented an indicated in the XRD pattern of FIG. 5A. Then, sample 7 was annealed at 800° C. and the platinum oxide film was converted into a platinum film. The resultant platinum film was mainly oriented to (111) direction, as indicated in the XRD pattern of FIG. 5B. From this result, it is concluded that the platinum film converted from a platinum oxide could not be (200)-oriented, in particular to the orientation degree over 90%.

Sample 8 was provided with a platinum thin film formed in accordance with the method disclosed in '422 patent. In other words, platinum was sequentially deposited in two steps under different atmospheres, i.e., firstly an oxygen containing platinum layer was formed under the same condition as that used in processing sample 1, then platinum was additionally deposited on the oxygen containing layer under an inert gas atmosphere (Ar), and then those two layers were annealed at 800° C.

Figure 6:
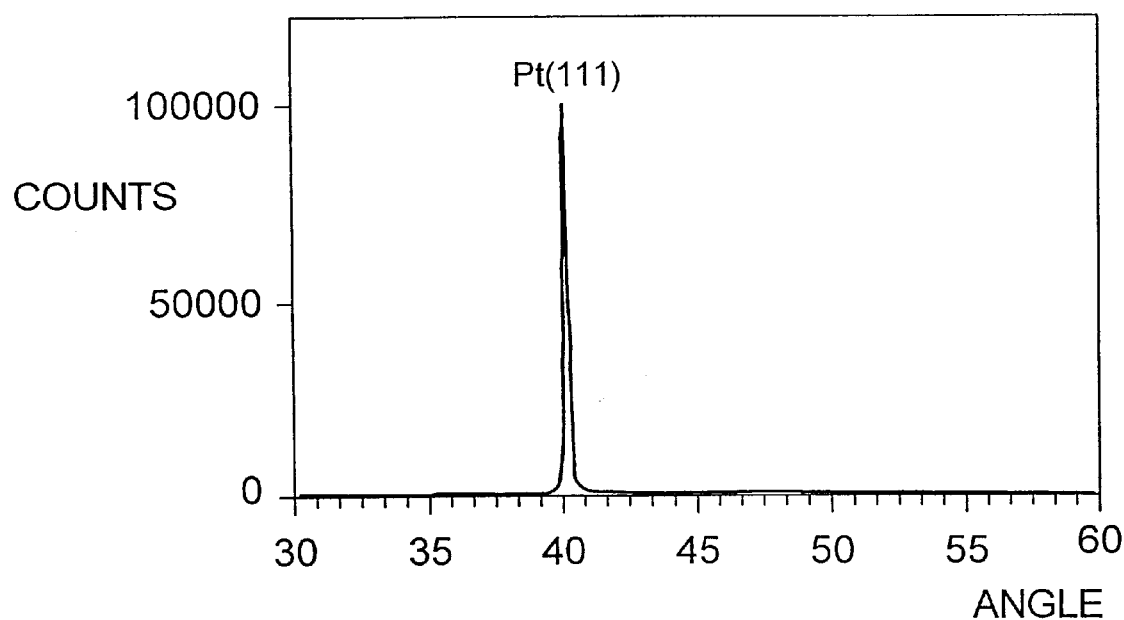
FIGS. 6 is an XRD pattern of platinum layer of sample 8, which platinum layer is formed by firstly forming an oxygen containing platinum layer, secondly depositing platinum on the oxygen containing platinum layer in addition under an inert gas atmosphere, and then annealing the oxygen containing platinum layer and the additionally deposited platinum layer.

FIG. 6 shows an XRD pattern of the resultant platinum layer of the sample 8 after annealing. From FIG. 6, it can be found that if platinum is deposited in two separate steps under different atmospheres, the resultant platinum layer could not be oriented to (200) direction.

As can be seen from the above table and FIGS. 3A to 6B, the platinum thin films formed according to examples (i) and (ii) of the present invention were proved to have a very high degree of preferred (200) orientation as compared to other platinum thin films formed according to the conventional methods.

Figure 8A:
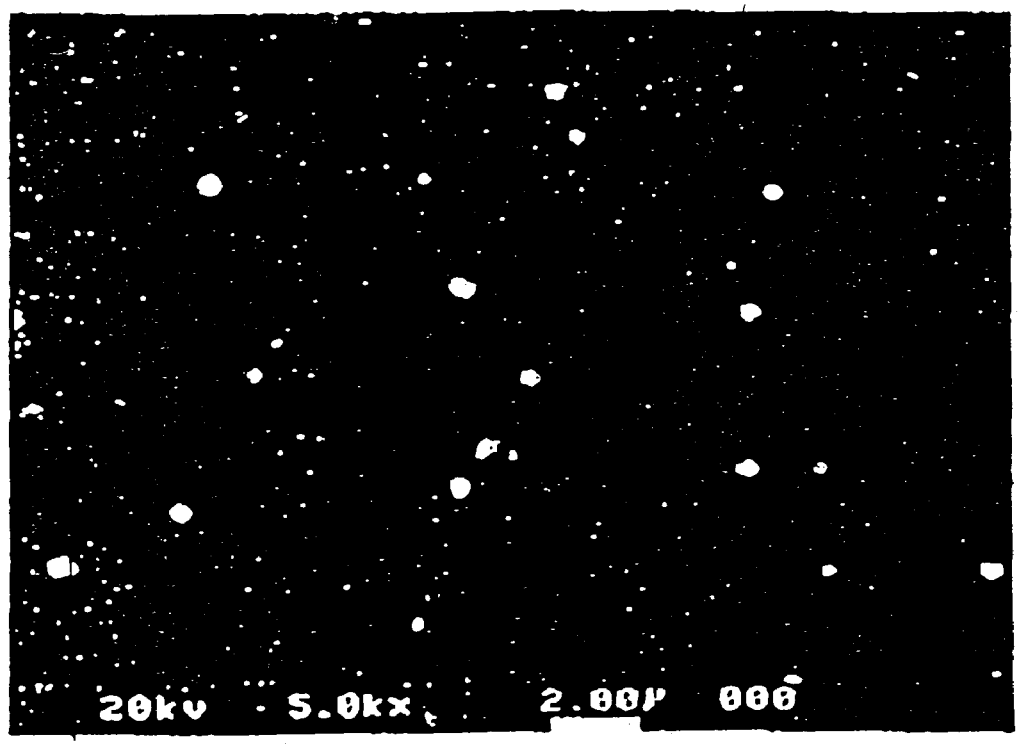
FIG. 8A is a SEM photograph showing the surface of sample 5 magnified by 5,000 times.
Figure 8B:
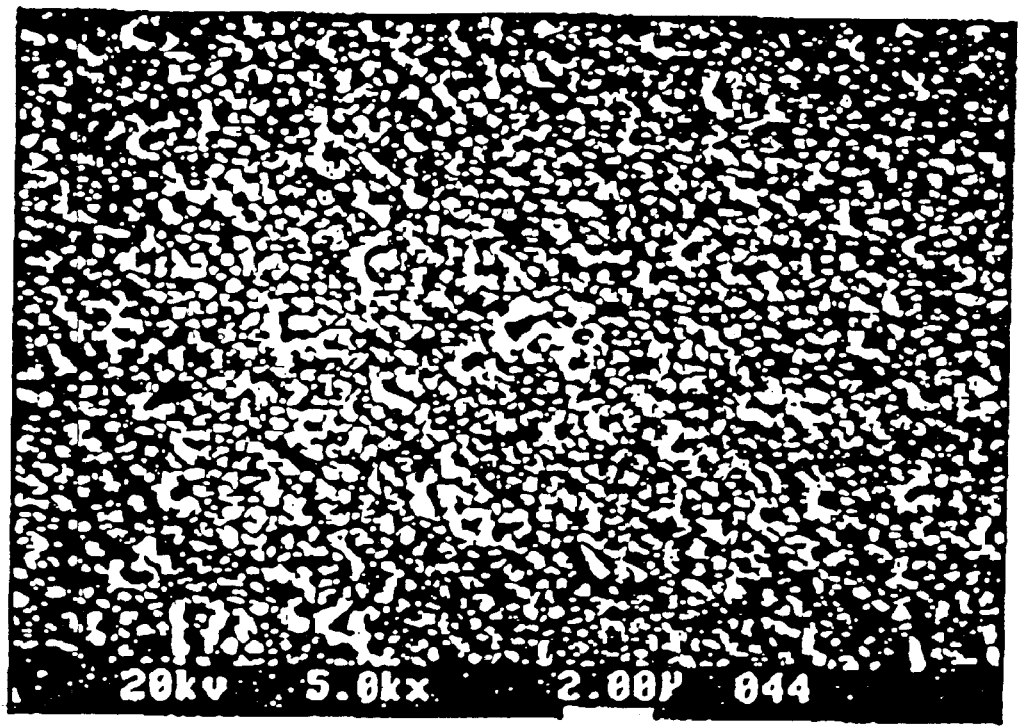
FIG. 8B is a SEM photograph showing the surface of sample 6 magnified by 5,000 times.

In terms of the microstructure of the platinum thin film, the surface of the platinum thin film manufactured according to examples (i) and (ii) of the present invention was proved to not contain any hillocks or voids as shown in FIGS. 7A (sample 1) and 7B (sample 4). On the contrary, the surface of the platinum thin film manufactured by the conventional method show many hillocks and/or voids as shown in FIGS. 8A (sample 5) and 8B (sample 6). Further, the repeated experiments conducted by the inventors demonstrated that the particle size may be controlled either in large or small size, as desired, in the micro structure of the platinum thin film manufactured by the present invention as shown in FIGS. 7A and 7B.

As described above, the present invention enables forming a (200)-oriented platinum thin film containing no hillock or void on the substrate, on which an insulating oxide layer has been formed. In other words, the present invention provides a method of depositing (200)-oriented platinum thin films as well as obtaining electric devices, such as a semiconductor devices (DRAM, FRAM) or an oxide thin film sensor devices, by making use of the well-known process for circuit patterning, i.e., etching or photolithography, after forming at least one type of the films, such as a silicon integrated circuit film, a ferroelectric film, a magnetic film, a piezoelectric film or an insulating film on the substrate according to its physical properties as required for the final device. This is possible because the substrate, on which the platinum thin film is deposited by the method of the prevent invention, has the properties suitable in the field of micro electronic industry as described above.

What is claimed is:

1. A method of forming a (200)-oriented platinum thin film on a substrate, comprising the steps of:
    (a) providing a substrate;
    (b) forming an insulating oxide layer on the surface of the substrate;
    (c) forming an "oxygen containing platinum layer" on the insulating oxide layer by depositing platinum on the insulating oxide layer at a temperature between 25° C. and 700° C. under an oxygen containing atmosphere, which consists of a mixture of an inert gas with either oxygen or ozone existing under a partial pressure ratio of 5% to 15%; and
    (d) annealing the oxygen containing platinum layer at a temperature between about 400° C. and about 1,000° C., without additional deposition of platinum on the "oxygen containing platinum layer", and thus converting the "oxygen containing platinum layer" into a platinum layer that in substantially free of oxygen and (200)-oriented, and whose (200) orientation degree, $f_{200}$ as defined by the following equation in over 90%, $$f_{200} = \frac{I_{200}}{I_{111} + I_{200}}(\times 100)$$

,wherein $I_{111}$ represents signal intensity of (111) direction in X-ray diffraction, and $I_{200}$ represents signal intensity of (200) direction in X-ray diffraction.

2. A method of claim 1, wherein said substrate is a single crystal substrate selected from the group consisting of silicon, MgO, $SrTiO_3$, and sapphire.

3. A method of claim 1, wherein said substrate is a polycrystal substrate selected from the group consisting of alumina or diamond.

4. A method of claim 1, wherein said substrate is a metallic substrate.

5. A method of claim 1, wherein said insulating oxide layer is formed from a dielectric material selected from the group consisting of $SiO_2$, alumina, and MgO.

6. A method of claim 1, wherein said substrate in maintained at a temperature between about 300° C. and about 700° C. while the platinum is being deposited in step c).

7. A method of claim 1, wherein the platinum is deposited by a DC/RF magnetron sputtering process.

8. A method if claim 1, wherein the platinum is deposited by a vacuum evaporation process.

9. A method of claim 1, wherein the platinum is deposited by an MOCVD process.

10. A method of claim 1, wherein the platinum in deposited by an ion plating process.

11. A method of forming a (200)-oriented platinum thin film on a substrate, comprising the steps of:
    (a) providing a substrate;
    (b) forming an insulating oxide layer on the surface of the substrate;
    (c) forming an "oxygen containing platinum layer" on the insulating oxide layer by depositing platinum on the insulating oxide layer at a temperature between 25° C. and 700° C. under an oxygen containing atmosphere, which consists of a mixture of an inert gas with either oxygen or ozone existing under a partial pressure ratio of 5% to 15%;
    (d) annealing the oxygen containing platinum layer at a temperature between about 400° C. and about 1000° C., without additional deposition of platinum on the "oxygen containing platinum layer", and thus converting the "oxygen containing platinum layer" into a platinum layer that is substantially free of oxygen and (200)-oriented and, whose (200) orientation degree, $f_{200}$ as defined by the following equation is over 90%, $$f_{200} = \frac{I_{200}}{I_{111} + I_{200}}(\times 100)$$

,wherein $I_{111}$ represents signal intensity of (111) direction in X-ray diffraction, and $I_{200}$ represents signal intensity of (200) direction in X-ray diffraction; and
    (e) forming at least one or more thin films selected from the group consisting of a silicon integrated circuit film, a ferroelectric film, a magnetic film, a piezoelectric film and a dielectric film above the (200)-oriented platinum layer.

12. A method of claim 11, wherein said ferroelectric film is one or more films selected from the group consisting of BT ($BaTiO_3$), PT ($PbTiO_3$), PZT ($PbZr_{1-x}Ti_xO_3$), PLZT ($Pb_{1-x}La_xZr_{1-y}Ti_yO_3$), BST ($Ba_{1-x}Sr_xTiO_3$), and SBTO ($SrBi_2Ta_2O_9$).

13. A method of claim 11, further comprising a step of forming a bottom electrode of an electric device by patterning the platinum layer.

14. A method as claimed in claim 13, wherein said electric device is a semiconductor device.

15. A method of as claimed in claim 13, wherein said electric device is a thin film sensor device.

16. A method of claim 11, wherein said substrate is a single crystal substrate selected from the group consisting of silicon, MgO, $SrTiO_3$, and sapphire.

17. A method of claim 11, wherein said substrate is a polycrystal substrate selected from the group consisting of alumina and diamond.

18. A method of claim 11, wherein said substrate in a metallic substrate.

19. A method of claim 11, wherein said insulating oxide layer consists of a dielectric material elected from the group consisting $SiO_2$, alumina, and MgO.

20. A method of claim 11, wherein said substrate is maintained at a temperature between about 300° C. and about 700° C. while the platinum is being deposited in step c).

21. A method of claim 11, wherein the platinum to deposited by a DC/RF magnetron sputtering process.

22. A method of claim 11, wherein the platinum layer is deposited by a vacuum evaporation process.

23. A method of claim 11, wherein the platinum is deposited by an MOCVD process.

24. A method of claim 11, wherein the platinum is deposited by an ion plating process.

25. A method of depositing a platinum thin film with a preferred (200) orientation on a substrate, comprising the steps of:

providing a substrate;

forming an insulating oxide layer on a surface of the substrate;

forming an oxygen containing platinum layer on the substrate with platinum deposited on the insulating oxide layer by heating the substrate to a temperature of up to 700° C. under an oxygen containing atmosphere;

converting the oxygen containing platinum layer into a platinum layer by means of annealing the substrate in a temperature range of 400° C. to 1000° C., by which a platinum layer having a degree of (200) orientation over 90% grade as defined by the following equation is formed, $$f_{200} = \frac{I_{200}}{I_{111} + I_{200}} (\times 100)$$

wherein in the above equation, $I_{111}$ represents (111) intensity in X-ray diffraction, where $I_{200}$ represents (200) intensity in X-ray diffraction, and wherein said oxygen containing atmosphere is a mixture of inert gas with either oxygen or ozone existing under a pressure ratio of 5% to 15%.

26. A method as claimed in claim 25, wherein the method consists essentially of said steps.

* * * * *